US009838634B2

(12) United States Patent
Koifman et al.

(10) Patent No.: US 9,838,634 B2
(45) Date of Patent: Dec. 5, 2017

(54) FAST READING OF A PIXEL (71) Applicants: Vladimir Koifman, Rishon Lezion (IL); Tiberiu Galambos, Binyamina (IL)

(72) Inventors: Vladimir Koifman, Rishon Lezion (IL); Tiberiu Galambos, Binyamina (IL)

(73) Assignee: ANALOG VALUE LTD., Rishon Lezion (IL)

( * ) Notice: Subject to any disclaimer, the term of this patent is extended or adjusted under 35 U.S.C. 154(b) by 252 days.

(21) Appl. No.: 14/849,780

(22) Filed: Sep. 10, 2015

(65) Prior Publication Data
US 2016/0225807 A1   Aug. 4, 2016

Related U.S. Application Data (60) Provisional application No. 62/111,107, filed on Feb. 3, 2015.

(51) Int. Cl.
    H01L 27/00      (2006.01)
    H04N 5/378     (2011.01)
    H01L 27/146    (2006.01)
(52) U.S. Cl.
    CPC ....... *H04N 5/378* (2013.01); *H01L 27/14641* (2013.01)

(58) Field of Classification Search
    CPC .................... H04N 5/378; H04N 5/3745
    See application file for complete search history.

(56) References Cited

U.S. PATENT DOCUMENTS

2012/0091323 A1\*  4/2012  Kawahito ............ H04N 5/3575
                                                       250/214 P
2014/0085523 A1\*  3/2014  Hynecek ........... H01L 27/14605
                                                       348/311

\* cited by examiner

*Primary Examiner* — Thanh Luu
(74) *Attorney, Agent, or Firm* — Reches Patents (57) ABSTRACT

A device that may include a pixel, an output conductor and a charge accelerator; wherein during a readout phase of the pixel, the pixel is configured to attempt to charge the output conductor to a pixel reset voltage and the charge accelerator is configured to perform a sampling operation and a charge operation; wherein during the sampling operation the charge accelerator is configured to sample a change in an output conductor voltage; wherein during the charge operation the charge accelerator is configured to output a charge accelerator output signal that is responsive to the change of the output conductor voltage, wherein once provided, the charge accelerator output signal accelerates a charging of the output conductor to a target voltage that is proximate to the pixel reset voltage; wherein the sampling operation and the charge operation do not overlap.

17 Claims, 12 Drawing Sheets

Attempting, by a pixel, during a readout phase of the pixel, to charge an output conductor that is coupled to the pixel to a pixel reset voltage. 110

Performing, during the readout phase of the pixel and by a charge accelerator coupled to the pixel, a sampling operation. Sampling by the charge accelerator a change in an output conductor voltage. 120

Performing, during the readout phase of the pixel and by the charge accelerator coupled to the pixel, a charge operation. Outputting by the charge accelerator a charge accelerator output signal that is responsive to the change of the output conductor voltage. Once provided, the charge accelerator output signal accelerates a charging of the output conductor to a target voltage that is proximate to the pixel reset voltage. 130

FAST READING OF A PIXEL

BACKGROUND

Pixel arrays include rows and columns of pixels. Multiple pixels may be coupled to a column line. The column line couples the pixels to a readout circuit.

During a readout phase an output signal of the pixel is send through the column line to the readout circuit. The pixel aims to charge (or discharge) the column line to a desired target voltage. Due to the capacitance and resistance of the column line the charging (or discharging) process may be time consuming and energy consuming.

There is a growing need to provide fast method for reading pixels.

SUMMARY

According to an embodiment of the invention there may be provided a device that may include a pixel, an output conductor and a charge accelerator; wherein during a readout phase of the pixel, the pixel is configured to attempt to charge the output conductor to a pixel reset voltage and the charge accelerator is configured to perform a sampling operation and a charge operation; wherein during the sampling operation the charge accelerator is configured to sample a change in an output conductor voltage; wherein during the charge operation the charge accelerator is configured to output a charge accelerator output signal that is responsive to the change of the output conductor voltage, wherein once provided, the charge accelerator output signal accelerates a charging of the output conductor to a target voltage that is proximate to the pixel reset voltage; wherein the sampling operation and the charge operation do not overlap.

The charge accelerator may be configured to provide the charge accelerator output signal to the output conductor.

The charge accelerator may be configured to provide the charge accelerator output signal to an electrical component coupled to the output conductor.

The charge accelerator may be configured to provide the charge accelerator output signal to a resistor coupled to the output conductor.

The provision of the charge accelerator output signal to the resistor may results in a resistor voltage that substantially equals a change in the output conductor voltage that is induced by the provision of the charge accelerator output signal to the resistor.

The charge accelerator may include a sampling and amplification circuit and a bias circuit that may be configured to provide a bias signal to the sampling and amplification circuit, wherein an absolute value of amplitude of the bias signal exceeds an expected absolute value of noises sampled during the sampling operation.

During the readout phase of the pixel, the charge accelerator may be configured to perform multiple sampling operations and multiple charge operation; wherein each sampling operation does not overlap any charge operation.

The charge accelerator may include a sampling and amplification circuit and a bias circuit that may be configured to provide a bias signal to the sampling and amplification circuit, wherein during a charge operation that occurs when the conductor output voltage is near the target voltage, the provision of bias signal masks noises sampled during a last sampling operation that preceded the charge operation.

The device may include additional pixels that share the output conductor and a selection circuit for selecting, a pixel to be read by a readout circuit, out of a group of pixels that may include the pixels and the additional pixels.

The charge accelerator may be coupled to a center of the output conductor.

The device may include an additional charge accelerator; wherein the charge accelerator and the additional charge accelerator are coupled to different ends of the output conductor.

During a second readout phase of the pixel, the pixel may be configured to attempt to charge the output conductor to a pixel data voltage and the charge accelerator may be configured to perform an additional sampling operation and an additional charge operation; wherein during the additional sampling operation the charge accelerator may be configured to sample an additional change in the output conductor voltage; wherein during the additional charge operation the charge accelerator may be configured to output an additional charge accelerator output signal that is responsive to the additional change of the output conductor voltage, wherein once provided, the additional charge accelerator output signal accelerates a charging of the output conductor to an additional target voltage that is proximate to the pixel data voltage; wherein the additional sampling operation and the additional charge operation do not overlap.

The device may include multiple pixels that are arranged in multiple groups of pixels; wherein the multiple groups of pixels are coupled to multiple readout circuits via multiple output conductor; wherein a given charge accelerator of a given group of pixels is adapted to output a given charge accelerator output signal for accelerating a charging of given output conductor that is coupled to the given group of pixels; wherein the given charge accelerator is further adapted to output to a neighboring output conductor of a neighboring group of pixels an additional charge accelerator output signal.

The additional charge accelerator output signal and the given charge accelerator output signal may have reverse polarities.

The additional charge accelerator output signal may have a lower magnitude than the given charge accelerator output signal.

The ratio between magnitudes of the additional charge accelerator output signal and the given charge accelerator output signal may be responsive to a ratio between a capacitance of the given conductor and a capacitance between the given output conductor and the neighboring output conductor.

The given charge accelerator may be adapted to output to a plurality of neighboring output conductors of a plurality of neighboring groups of pixels additional charge accelerator output signals.

According to an embodiment of the invention there may be provided a method that may include attempting, by a pixel, during a readout phase of the pixel, to charge an output conductor that is coupled to the pixel to a pixel reset voltage; performing, during the readout phase of the pixel and by a charge accelerator coupled to the pixel, a sampling operation and a charge operation; wherein the performing of the sampling operation comprises sampling by the charge accelerator a change in an output conductor voltage; wherein the performing of the charge operation comprises outputting by the charge accelerator a charge accelerator output signal that is responsive to the change of the output conductor voltage, wherein once provided, the charge accelerator output signal accelerates a charging of the output conductor to a target voltage that is proximate to the pixel reset voltage; and wherein the sampling operation and the charge operation do not overlap.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

According to an embodiment of the invention there is provided a method for charge acceleration that includes two spaced apart (in the time domain) operations—a sampling operation and a feedback operation (also referred to as charge injection operation).

The separation between the sampling operation and the feedback operation prevents (or substantially reduces) errors introduced in the sampling operation due to the feedback operation.

Such errors may occur when there is no separation between the sample and the feedback operations—for example when attempting to continuously sample and feedback.

It was also found that the suggested method provides a stable solution and prevents unwanted oscillation that may occur when applying a continuous and simultaneous sample and feedback.

In is assumed, for clarity of explanation, that the device applies correlated double sampling, and especially a correlated double sampling scheme that includes (a) a first readout phase in which the pixel attempts to output a reset voltage, and (b) a second readout phase in which the pixel outputs pixel data. The pixel data is responsive to radiation sensed by the pixel.

It is noted that the suggested method and device may be applied mutatis mutandis when correlated double sampling is not applied.

Figure 1:
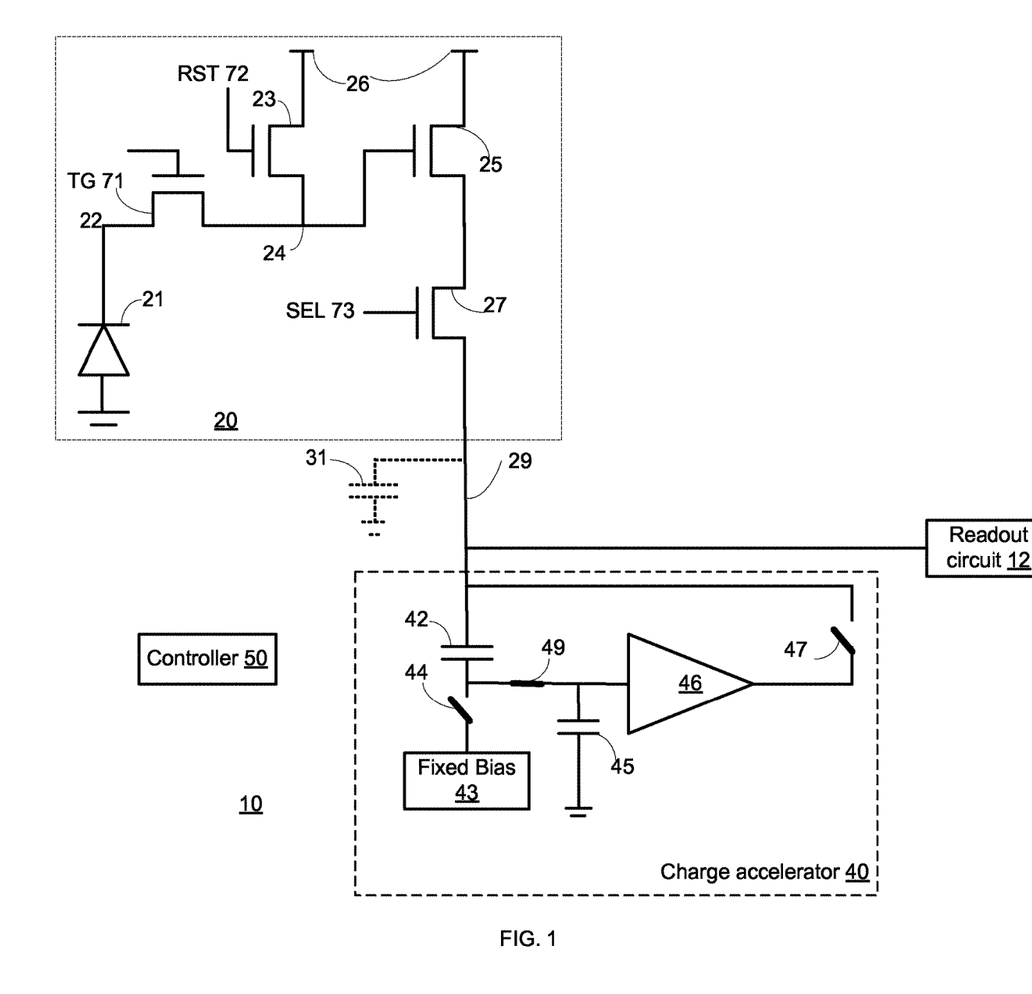
FIG. 1 illustrates a device that includes a pixel, an output conductor, a readout circuit and a charge accelerator according to an embodiment of the invention.

FIG. 1 illustrates a device 10 that includes a pixel 20, output conductor 29, charge accelerator 40 and readout circuit 12, during a sampling operation, according to an embodiment of the invention.

Figure 2:
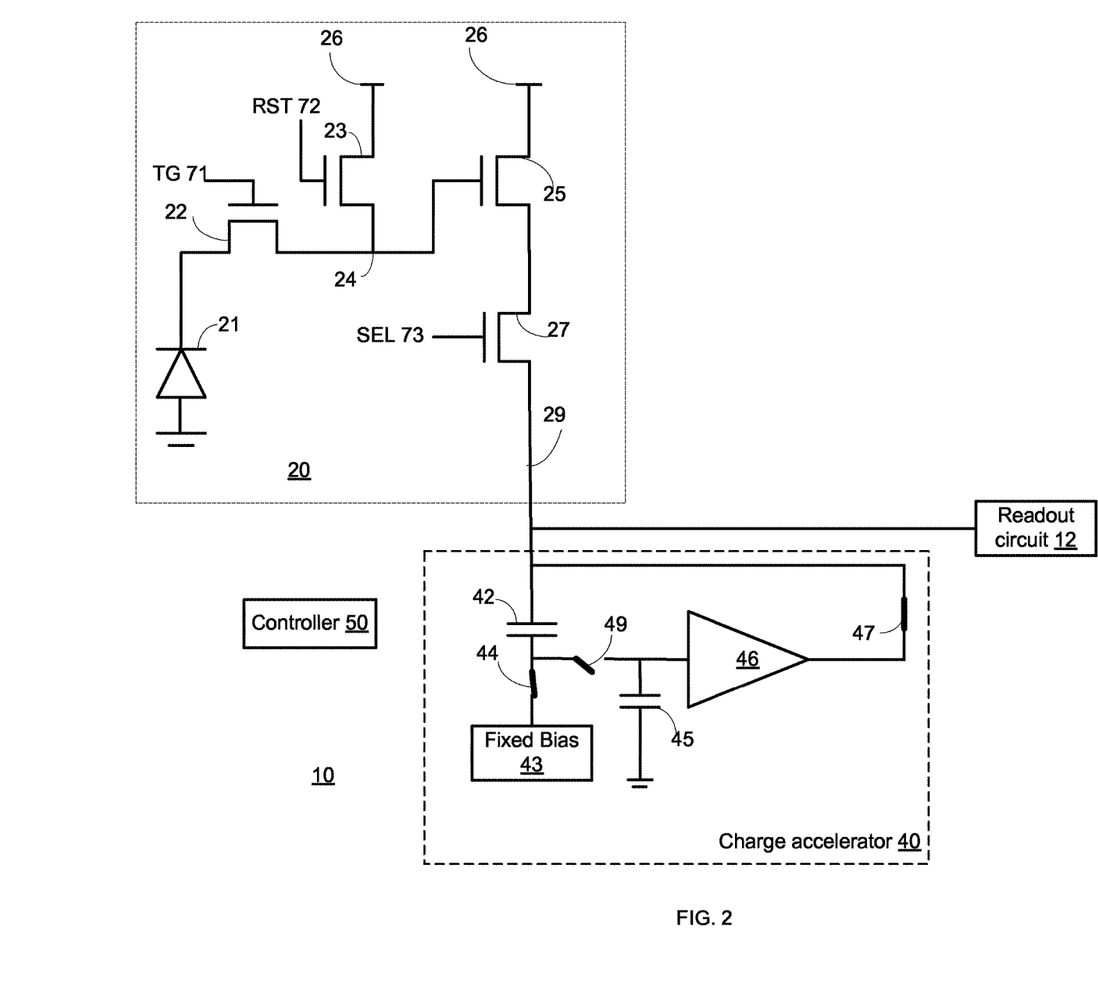
FIG. 2 illustrates a device that includes a pixel, an output conductor, a readout circuit and a charge accelerator according to an embodiment of the invention.

FIG. 2 illustrates a device 10 that includes a pixel 20, output conductor 29, charge accelerator 40 and readout circuit 12, during a feedback operation, according to an embodiment of the invention.

Device 10 may include any type of pixel. Pixel 20 is a non-limiting example of a pixel. It is termed a 4T pixel as it includes four transistors. Pixel 20 may include three transistors or have more than four transistors.

Pixel 20 includes a photodiode 21, a transfer gate transistor 22, a reset transistor 23 a select transistor 27 and an output transistor 25. The gate of transfer gate transistor 22 is fed by transfer gate control signal TG 71. The gate of reset transistor 23 is fed by reset signal RST 72, the gate of select transistor 27 is fed by select signal SEL 73 and the gate of output transistor 25 is coupled to a floating diffusion node 24 of pixel 20.

The source of select transistor 27 is coupled vie output conductor 29 to readout circuit 12 and charge accelerator 40.

FIG. 1 also illustrates the capacitance 31 of output conductor. This may be a parasitic capacitance that has to be charged and/or discharged by pixel 20.

Charge accelerator 40 may include a fixed bias 43 (that may also be a ground connection), first capacitor 42, second capacitor 45, amplifier 46, first switch 44, second switch 49 and third switch 47.

A first end of first capacitor 42 is connected to output conductor 29. A second end of first capacitor 42 is connected to a first end of first switch 44 and to a first end of second switch 49. A second end of first switch 44 is connected to fixed bias 43. A second end of second switch 49 is connected to an input of amplifier 46 and to a first end of second capacitor 45. An output of amplifier 46 is connected to a first end of third switch 47. A second end of third switch 47 is connected to output conductor 29.

During a first readout phase pixel 20 attempts to set the voltage of output conductor 29 to a pixel reset voltage.

Charge accelerator 40 may execute one or more iteration of a sampling operation and of a feedback operation during each one of a first readout phase and a second readout phase.

During the sampling operation, the first and third switches 44 and 47 are open (disconnected) and second switch 49 is closed (connected).

During the sampling operation, second capacitor 45 is charged by output conductor 29 and via first capacitor 42 to a voltage that represents the change of the output conductor voltage (the change refers to the change of output conductor voltage during the sampling operation). The first capacitor 42 samples the derivative of the column voltage. The charge accelerator 40 may act as a negative capacitor—current taken from column line 29 has to be proportional to the derivative of the column voltage multiplied by minus one. The capacitance of first capacitor 42 may be significantly larger than the capacitance pf capacitor 45.

During the feedback operation the first and third switches 44 and 47 are closed (connected) and second switch 49 is open (disconnected).

The reason the first switch 44 is closed is in order to keep capacitor 42 charged to the column voltage so that the sampling should be sensitive to the derivative of the voltage only.

We denote Iout as the output current of the amplifier, Vin is the input voltage of the amplifier, Tfeedback is the duration of the feedback operation (charge injection—charging operation) and Tsample is the duration of the sampling operation—then when operating in a feedback phase, the amplifier can be considered as a negative transconductor (having transconductance of Gm) so that Iout=−Gm*Vin. During the feedback phase we have a current Iout=−Gm*Vsample=−Gm*Tsample*dVcolumn/dt. Averaging this equation we can get an expression for the negative capacitance we created. The average current taken from the column (we neglect the charge taken during the sampling phase) is Iavg~Iout*Tfeedback/(Tsample+Tfeedback). The negative capacitance is then Cneg~Iavg/(dVcolumn/dt)=−Gm*Tsample*Tfeedback/(Tsample+Tfeedback). The equation above also shows how the controller can vary the amount of negative capacitance generated by controlling the timing of the switches and thus keep the system stable, easier and way more manageable than continuous time implementations.

Figure 12:
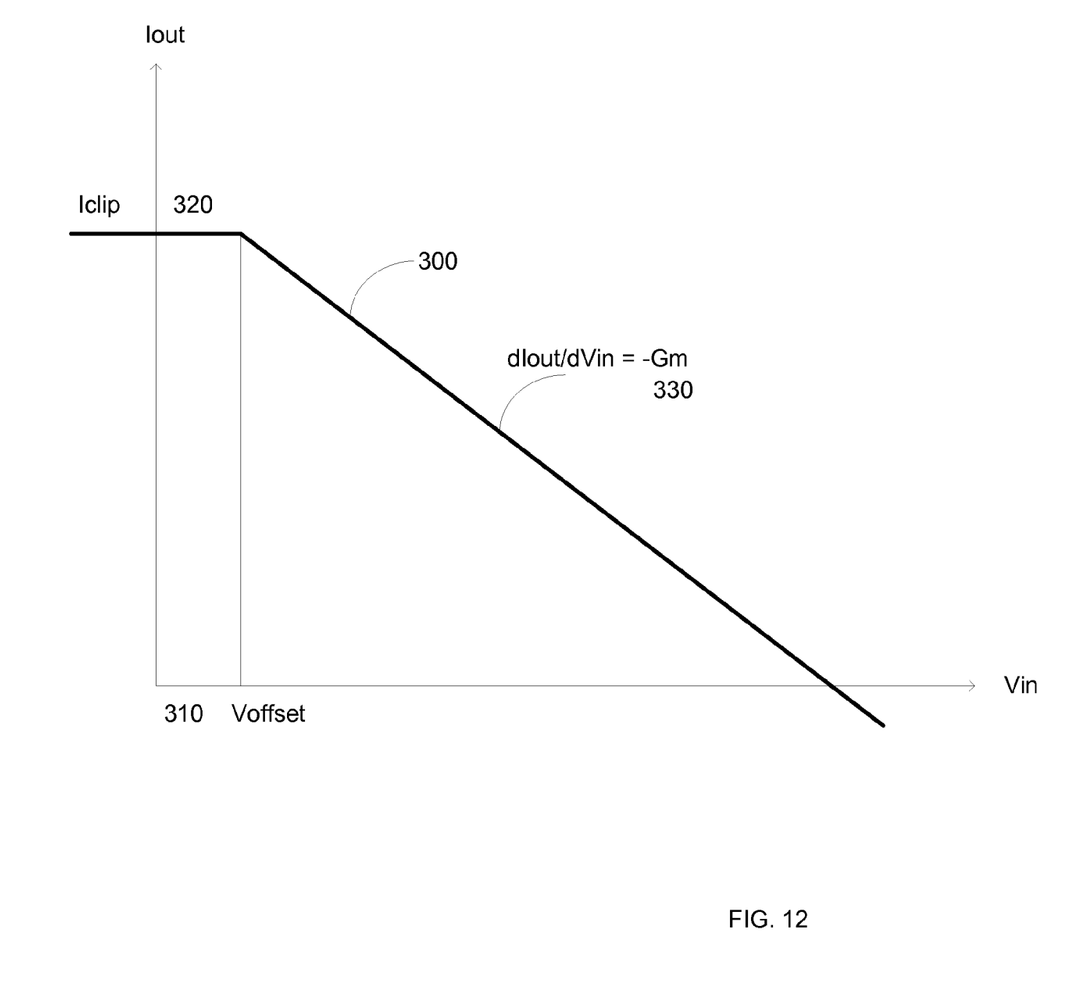
FIG. 12 illustrates the voltage to current characteristic of an amplifier according to an embodiment of the invention.

In order to avoid injecting noise into the final settling value of the column signal, amplifier 46 can have a non-linear clipping characteristic as shown in FIG. 12. If the input voltage of the amplifier is below Voffset 310, the output current is limited to the value Iclip 320. For input voltages in excess of Voffset 310, the transconductance is given by dIout/dVin=−Gm 330.

The amplifier 46 outputs an output a charge accelerator output signal that is responsive to the change of the output conductor voltage (sampled during the sampling operation). The amplifier 46 may have a gain that exceeds one so that once provided, the charge accelerator output signal accelerates a charging of the output conductor to a target voltage.

The charge accelerator 40 compensates for the capacitance 31 of the output conductor 29 and may be referred to as a negative capacitance circuit. The absolute value of the output conductor capacitance may exceed the absolute value of the negative capacitance.

FIG. 1 also illustrates controller 50. Controller 50 may be configured to control the operation of device 10. For example, controller 50 may control which one of first switch 22, second switch 49 and third switch 47 is closed and/or open, and/or may send control signals (such as TG 71, RST 72 and SEL 73) to pixel 20).

Figure 3:
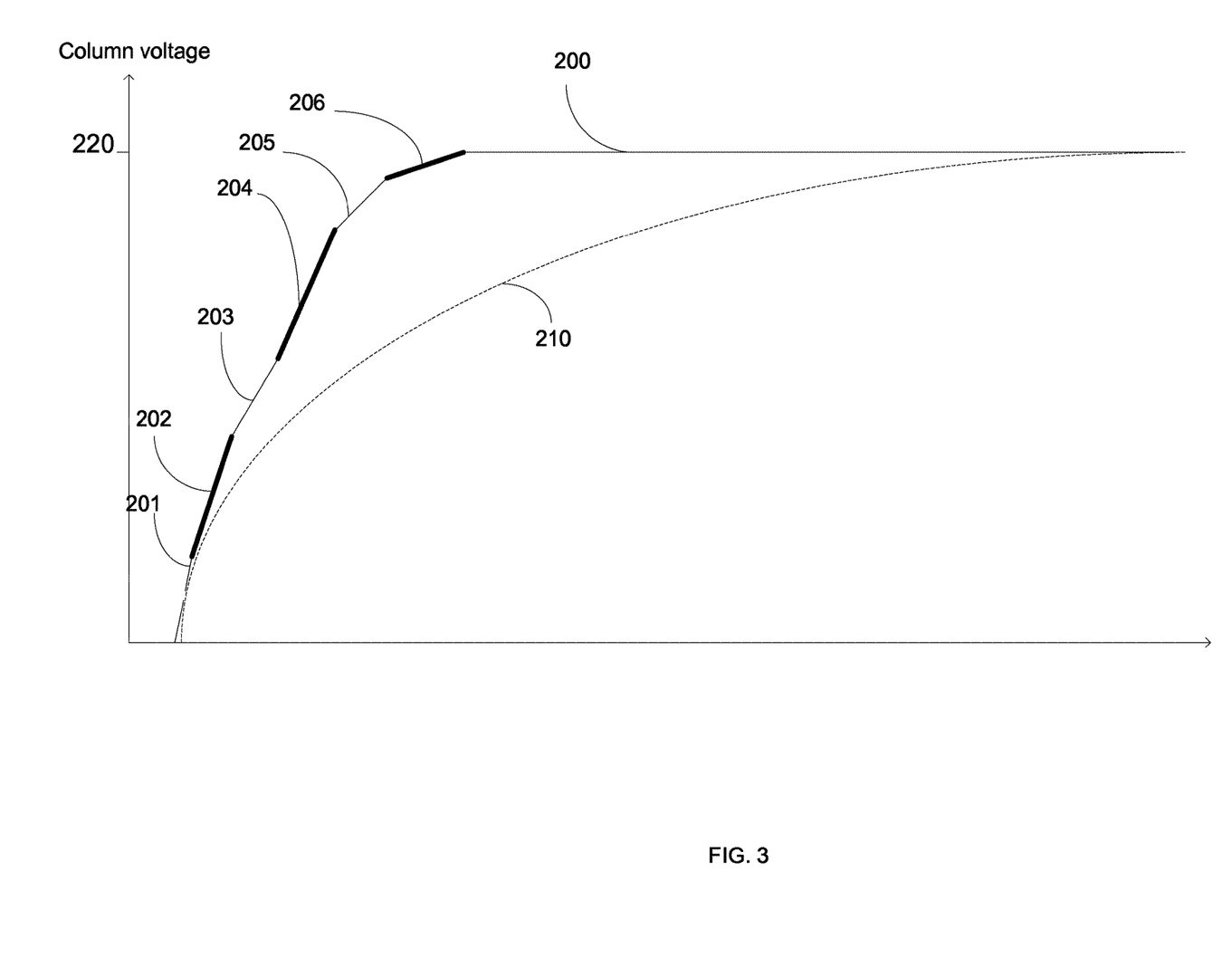
FIG. 3 is a timing diagram according to an embodiment of the invention.

FIG. 3 is a timing diagram that illustrates multiple sample and charge injection operations according to an embodiment of the invention.

The number of sample and charge injection operations during each readout phase may be one or may exceed one. FIG. 3 illustrates curve 210 that illustrates a charging of the output column to a target value 220 without acceleration and polygon 200 that illustrates a charging of the output column to target value 220 with sampling iterations (201, 203 and 205) and charging iterations (202, 202 and 206) performed by the charge accelerator.

If there are multiple sampling operations during a single readout phase then the duration of the multiple sampling operation s may be equal to each other. Alternatively, at least one sampling operation may be shorter than another sampling operation.

If there are multiple charge injection operations during a single readout phase then the duration of the multiple charge injection operations may be equal to each other. Alternatively, at least one charge injection operation may be shorter than another charge injection operation.

During the first readout phase the target voltage is proximate to the pixel reset voltage. During the second readout phase the target voltage is proximate to a pixel data voltage.

The term proximate may include small deviation—such as a deviation by up to 1%, 3% 5%, 10%, 15% percent, and the like.

According to an embodiment of the invention the charge accelerator output signal is not provided directly to the output conductor. The charge accelerator output signal may be provided indirectly (for example via another component) to the output conductor.

Figure 4:
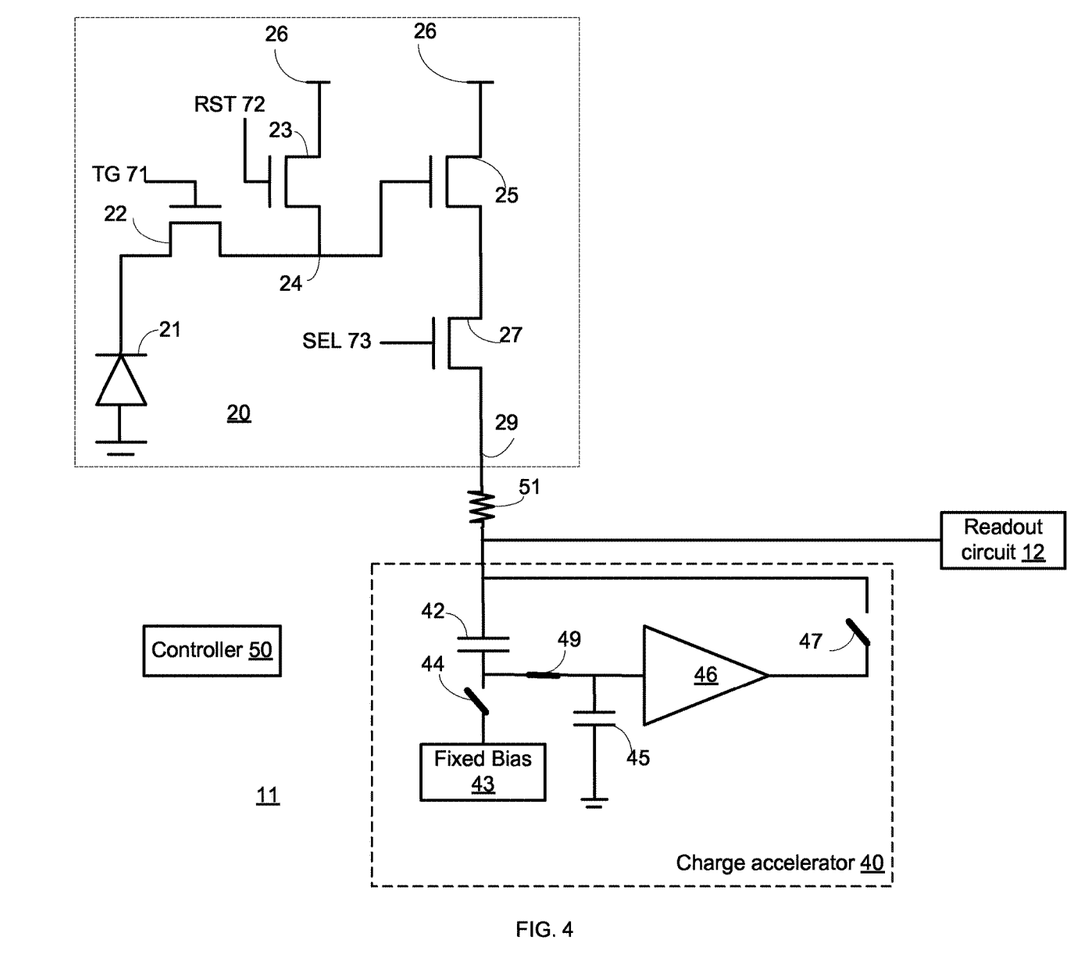
FIG. 4 illustrates a device that includes a pixel, an output conductor, a readout circuit and a charge accelerator according to an embodiment of the invention.

FIG. 4 illustrates a device 11 that includes a pixel 20, output conductor 29, charge accelerator 40, resistor 51 and readout circuit 12, during a sampling operation, according to an embodiment of the invention.

Resistor 51 is connected between output conductor 29 and a node that is connected to readout circuit 12 and the first end of first capacitor 32.

The value of resistor 51 may be selected in various manners. For example—a provision of the charge accelerator output signal to resistor 51 may result in a resistor voltage (voltage drop over resistor 51) that substantially equals a change in the output conductor voltage that is induced by the provision of the charge accelerator output signal to the resistor 51.

It is noted that resistor 51 may connected between output conductor 29 and the first end of first capacitor 32.

Figure 5:
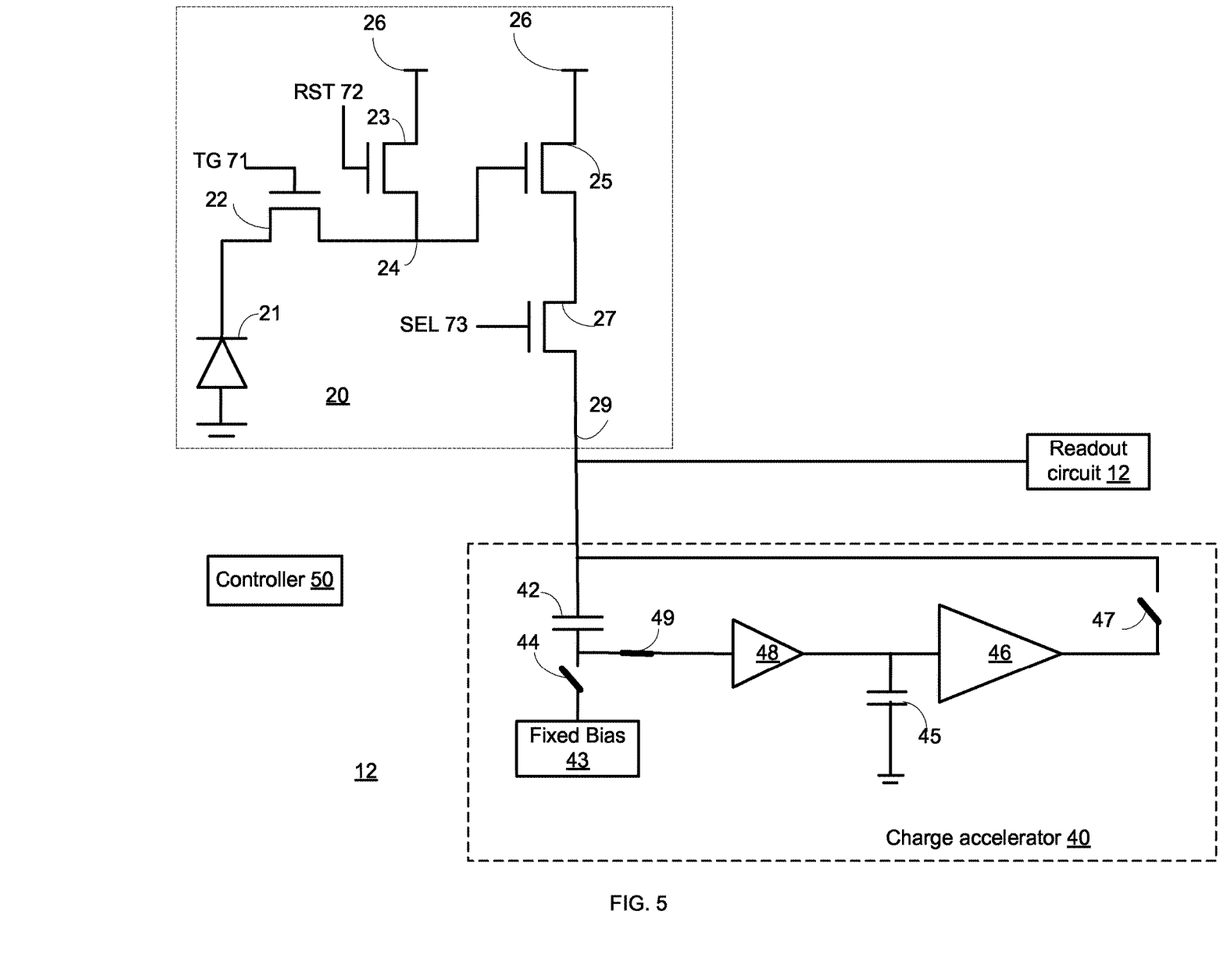
FIG. 5 illustrates a device that includes a pixel, an output conductor, a readout circuit and a charge accelerator according to an embodiment of the invention.

FIG. 5 illustrates a device 11 that includes a pixel 20, output conductor 29, charge accelerator 40, and readout circuit 12, during a sampling operation, according to an embodiment of the invention.

Charge accelerator 40 includes a buffer 48 between the first and second capacitors. Buffer 48 may prevent or reduce charge sharing between first and second capacitors 42 and 45. When buffer 48 is implemented capacitor 42 does not need to be significantly larger than capacitor 45.

Additionally or alternatively, charge sharing may be reduced or prevented by using a first capacitor 42 that has a capacitance that well exceeds the capacitance of second capacitor 45.

Figure 6:
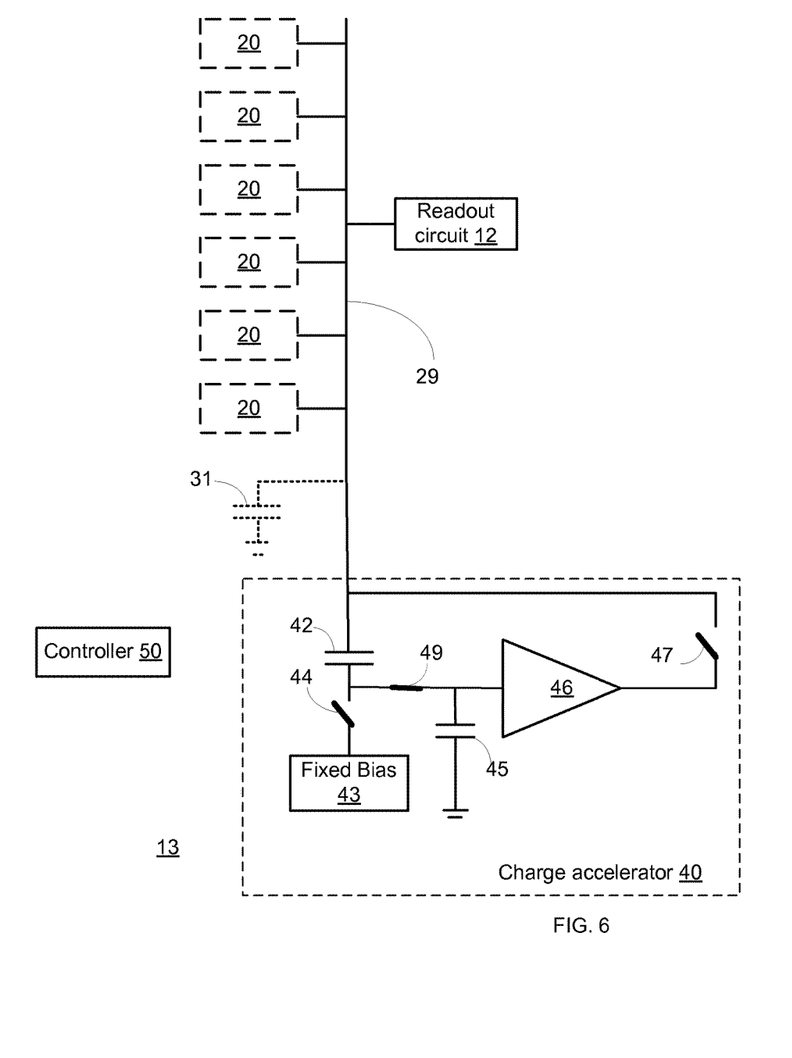
FIG. 6 illustrates a device that includes a column of pixels, an output conductor which is a column line, a readout circuit and a charge accelerator according to an embodiment of the invention.

FIG. 6 illustrates device 13 that includes column of pixels 20, an output conductor 29 which is a column line, a readout circuit 12 and a charge accelerator 40 according to an embodiment of the invention.

The readout circuit 12 and the charge accelerator 40 may be connected to any part of the column line. For example— the charge accelerator 40 may be connected to the center of the column line or located at a position that differs from the center of the column line.

FIG. 6 differs from FIG. 1 by illustrating a column of pixels 30 and not a single pixel. It is noted that the charge accelerator 40 may be coupled to any group of pixels—such as rows of pixels or any other arrangement of pixels.

Figure 7:
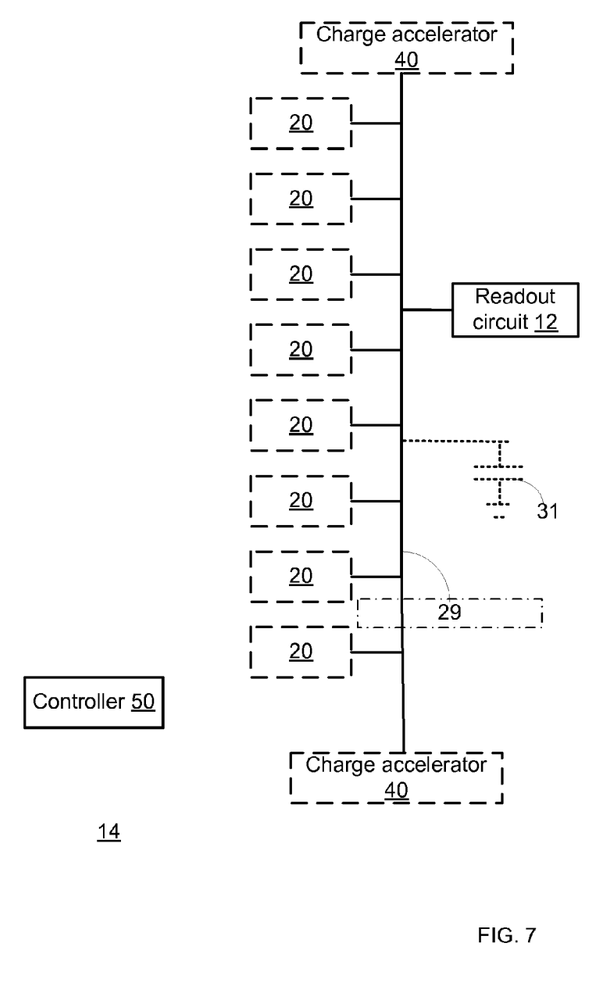
FIG. 7 illustrates a device that includes a column of pixels, an output conductor which is a column line, a readout circuit and two charge accelerators according to an embodiment of the invention.

FIG. 7 illustrates a device that includes a column of pixels 20, an output conductor 29 which is a column line, a readout circuit 12 and two charge accelerators 40 according to an embodiment of the invention.

The two charge accelerators 40 are coupled to opposite ends of the column line.

Each one of the readout circuit 12 and the charge accelerators 40 may be connected to any part of the column line.

While the previous figures related to compensation for the capacitance of a single output conductor, the charge accelerator may be applied for compensating unwanted coupling between groups of pixels—such as coupling between neighboring pixel columns.

Figure 8:
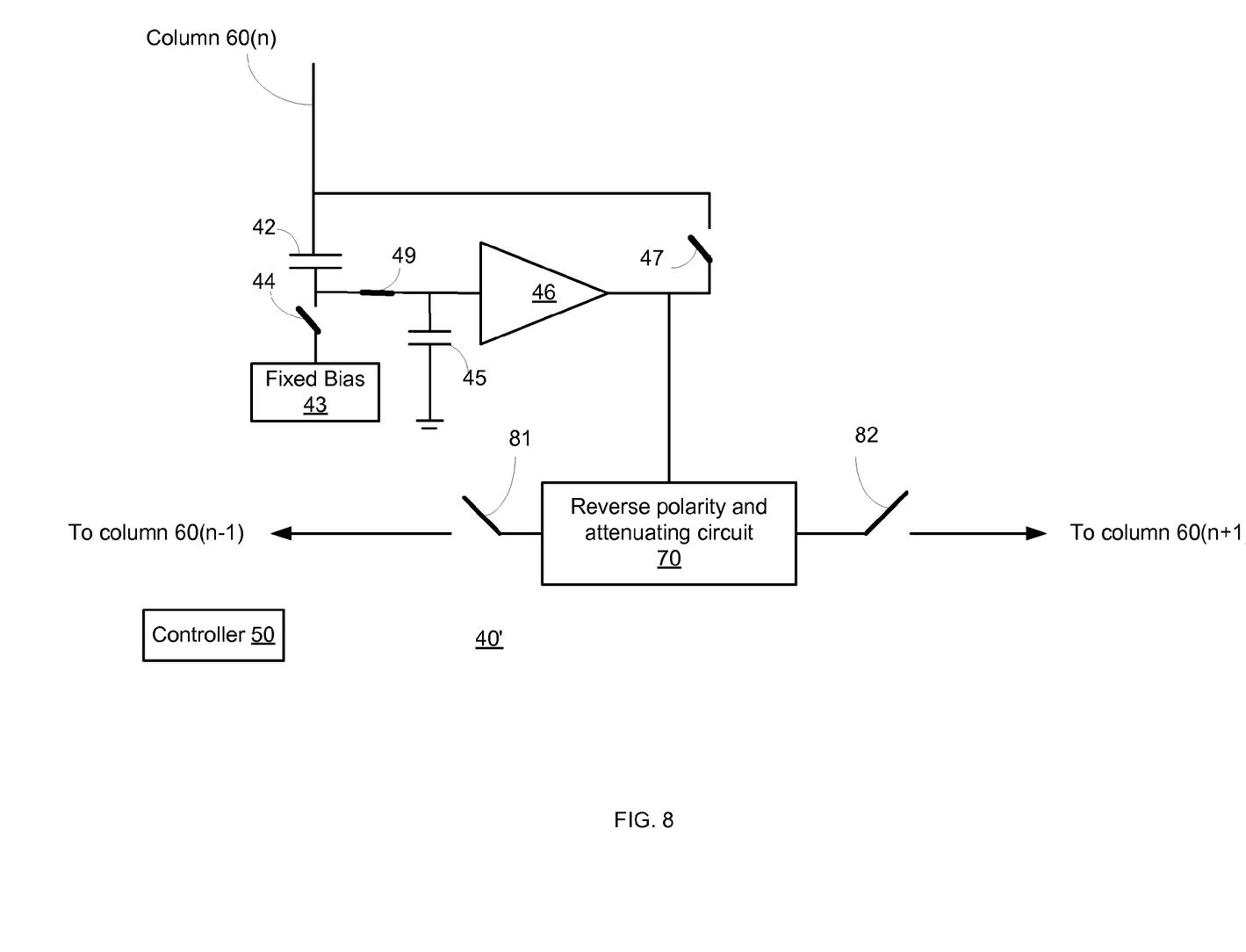
FIG. 8 illustrates a charge accelerator according to an embodiment of the invention.

FIG. 8 illustrates charge accelerator 40' according to an embodiment of the invention.

Figure 9:
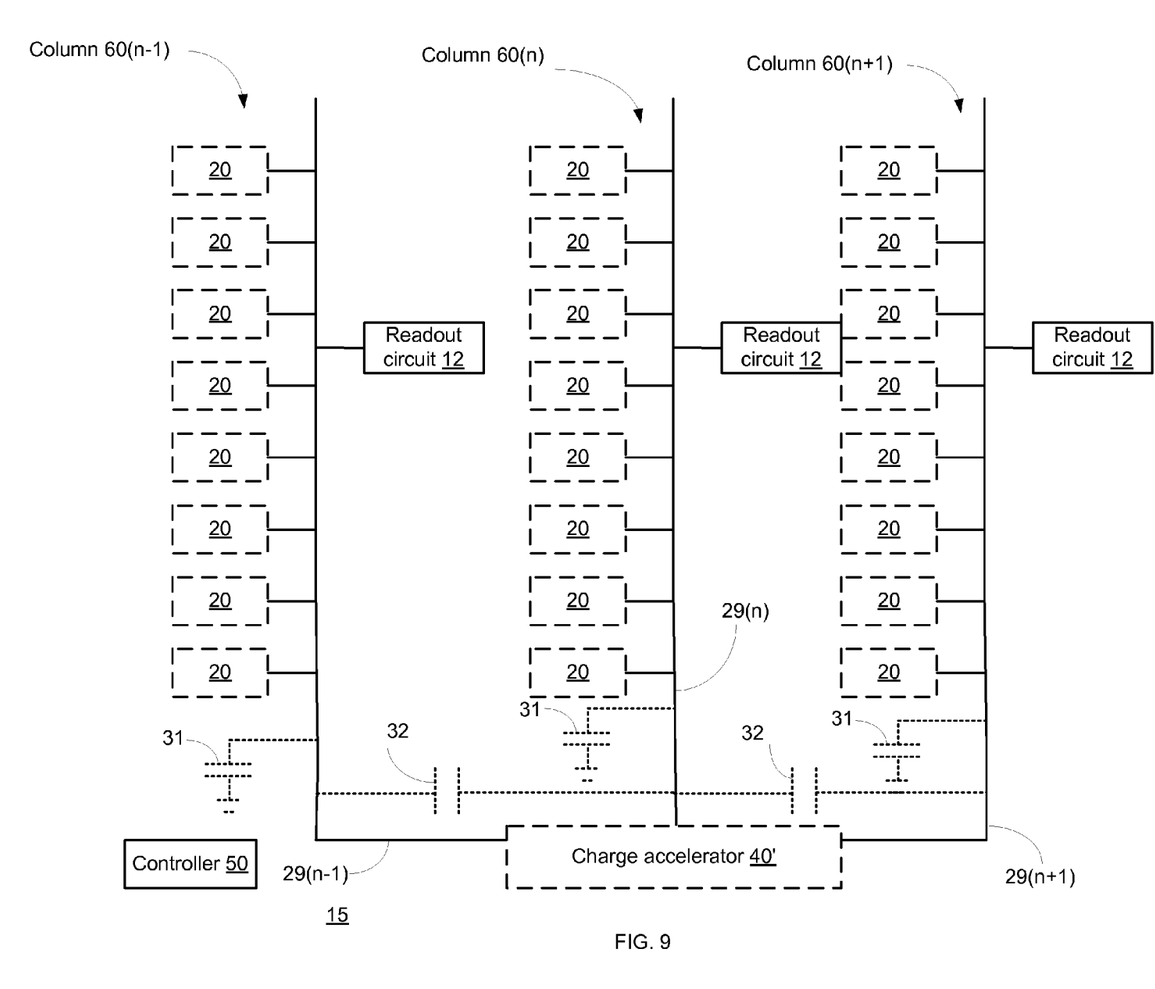
FIG. 9 illustrates a device that includes three columns of pixels, three output conductors which are column lines, three readout circuits and a charge accelerator according to an embodiment of the invention.

FIG. 9 illustrates device 15 that includes three columns of pixels 60(*n*−1), 60(*n*) and 60(*n*+1), three output conductors 29(*n*−1), 29(*n*) and 29(*n*+1) which are column lines, three readout circuits 12(*n*−1), 12(*n*) and 12(*n*+1) and a charge accelerator 40' according to an embodiment of the invention.

Charge accelerator 40' is configured to sample, during a sampling operation, the output voltage of an n'th column 60(*n*). Column 60(*n*) is proximate to neighboring columns 60(*n*−1) and 60(*n*+1).

Charge accelerator 40' is illustrated during a sampling phase.

Charge accelerator 40' differs from charge accelerator 40 of FIGS. 1-2 by including a reverse polarity and attenuating circuit 70 that is coupled to neighboring columns 60(*n*−1) and 60(*n*+1).

It is assumed that due to unwanted coupling between column 60(*n*) and each one of column 60(*n*−1) and 60(*n*+1) the feedback from amplifier 46 to column 60(*n*) changes the state of columns 60(*n*−1) and 60(*n*+1).

Reverse polarity and attenuating circuit 70 attempts to counter or at least partially counter this unwanted change of state of columns 60(*n*−1) and 60(*n*+1). This is achieved by providing, during the feedback operation, additional charge accelerator output signals that are of a reverse polarity to the charge accelerator output signal provided to column 60(*n*).

In addition, because the coupling between amplifier 46 and column 60(*n*) is much better than the coupling (via inter-column coupling) between amplifier 46 and each one of columns 60(*n*−1) and 60(*n*+1) then the additional charge accelerator output signals is attenuated by the reverse polarity and attenuating circuit 70.

Reverse polarity and attenuating circuit 70 is coupled to column 60(*n*−1) via first inter-column switch 81 and is coupled to column 60(*n*+1) via second inter-column switch 82.

First inter-column switch 81 and second inter-column switch 82 may be open (disconnected) during the sampling operation and closed (connected) during the feedback phase.

Figure 10:
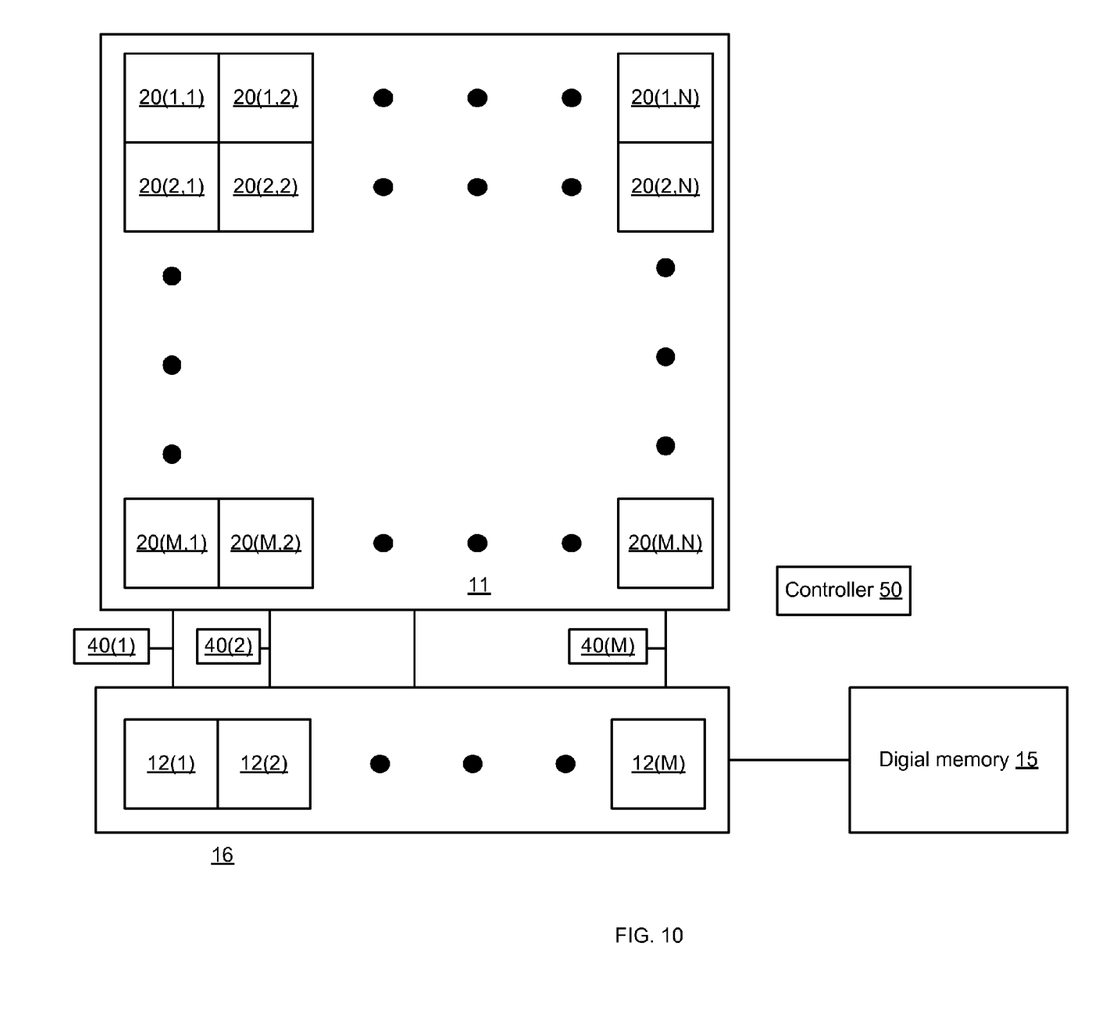
FIG. 10 illustrates a device that includes an array of pixels, an array of readout circuits and an array of charge accelerators according to an embodiment of the invention.

FIG. 10 illustrates device 16 that includes an array of pixels, an array of readout circuits and an array of charge accelerators according to an embodiment of the invention.

The array of pixels includes N columns and M rows.

Each column of pixels is coupled via a column line to a charge accelerator (such as charge accelerators 40(1)-40(M)) and to a readout circuit (such as readout circuits 12(1) and 12(M)).

The readout circuits are coupled to a digital memory 15.

Figure 11:
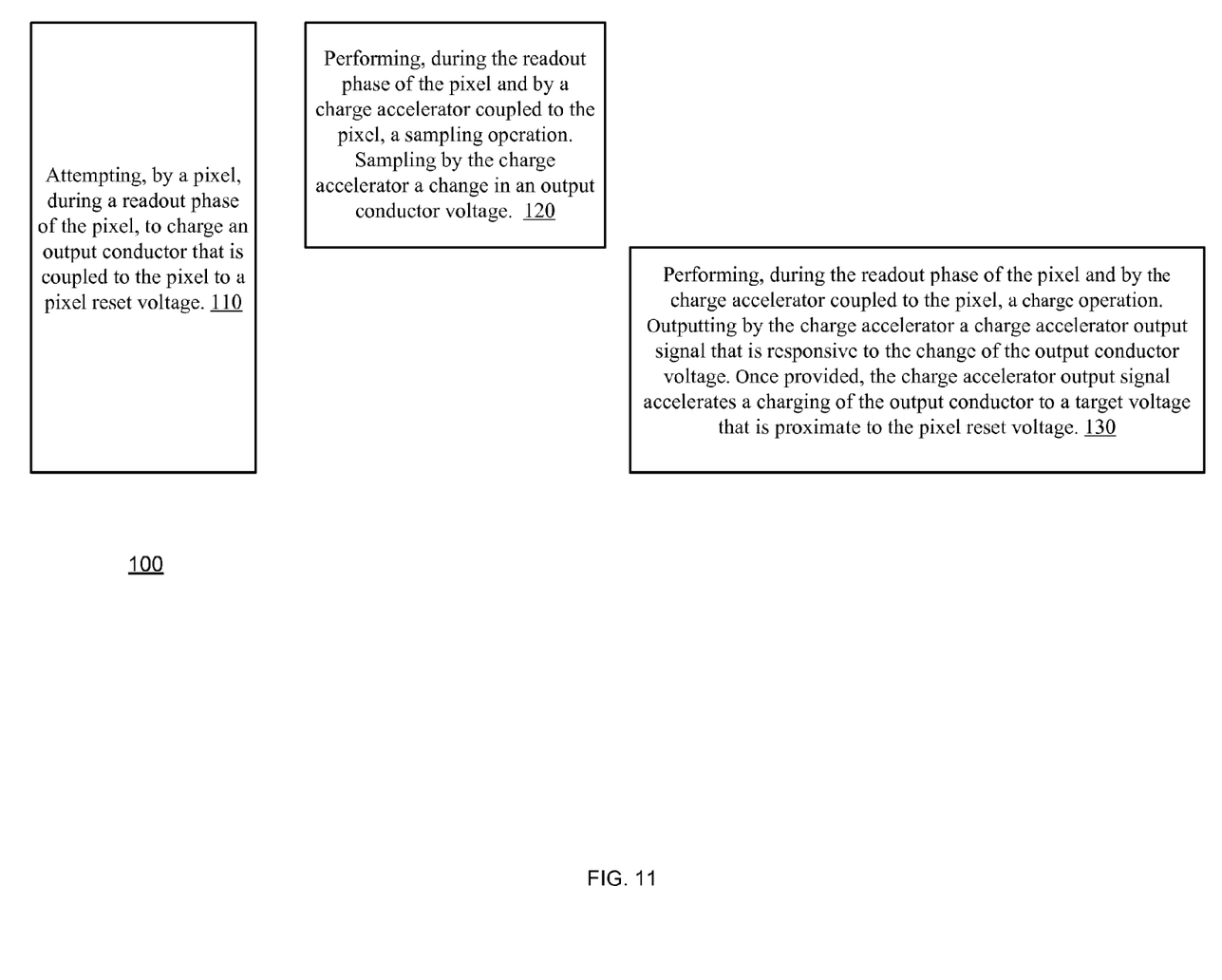
FIG. 11 illustrates a method according to an embodiment of the invention.

FIG. 11 illustrates a method 100 according to an embodiment of the invention.

Method 100 may start by steps 110, 120 and 130.

Step 110 may include attempting, by a pixel, during a readout phase of the pixel, to charge an output conductor that is coupled to the pixel to a pixel reset voltage.

Step 120 may include performing, during the readout phase of the pixel and by a charge accelerator coupled to the pixel, a sampling operation. Step 120 may include sampling by the charge accelerator a change in an output conductor voltage.

Step 130 may include performing, during the readout phase of the pixel and by the charge accelerator coupled to the pixel, a charge operation. Step 130 may include outputting by the charge accelerator a charge accelerator output signal that is responsive to the change of the output conductor voltage. Once provided, the charge accelerator output signal accelerates a charging of the output conductor to a target voltage that is proximate to the pixel reset voltage.

Steps 120 and 130 do not overlap—they are executed at different points of time of the readout phase.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality. Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same common mode noise choke. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A device comprising a pixel, additional pixels, an output conductor, a charge accelerator, a selection circuit, and an additional charge accelerator;

wherein during a readout phase of the pixel, the pixel is configured to attempt to charge the output conductor to a pixel reset voltage and the charge accelerator is configured to perform a sampling operation and a charge operation;

wherein during the sampling operation the charge accelerator is configured to sample a change in an output conductor voltage;

wherein during the charge operation the charge accelerator is configured to output a charge accelerator output signal that is responsive to the change of the output conductor voltage, wherein once provided, the charge accelerator output signal accelerates a charging of the output conductor to a target voltage that is proximate to the pixel reset voltage;

wherein the sampling operation and the charge operation do not overlap;

wherein the charge accelerator and the additional charge accelerator are coupled to different ends of the output conductor;

wherein the additional pixels share the output conductor; and wherein the selection circuit is for selecting a pixel to be read by a readout circuit, out of a group of pixels that comprises the pixel and the additional pixels.

2. The device according to claim 1 wherein the charge accelerator is configured to provide the charge accelerator output signal to the output conductor.

3. The device according to claim 1 wherein the charge accelerator is configured to provide the charge accelerator output signal to an electrical component coupled to the output conductor.

4. The device according to claim 1 wherein the charge accelerator is configured to provide the charge accelerator output signal to a resistor coupled to the output conductor.

5. The device according to claim 4 wherein a provision of the charge accelerator output signal to the resistor results in a resistor voltage that substantially equals a change in the output conductor voltage that is induced by the provision of the charge accelerator output signal to the resistor.

6. The device according to claim 1 wherein the charge accelerator comprises a sampling and amplification circuit and a bias circuit that is configured to provide a bias signal to the sampling and amplification circuit, wherein an absolute value of an amplitude of the bias signal exceeds an expected absolute value of noises sampled during the sampling operation.

7. The device according to claim 1 wherein during the readout phase of the pixel, the charge accelerator is configured to perform multiple sampling operations and multiple charge operation; wherein each sampling operation does not overlap any charge operation.

8. The device according to claim 7 wherein the charge accelerator comprises a sampling and amplification circuit and a bias circuit that is configured to provide a bias signal to the sampling and amplification circuit, wherein during a charge operation that occurs when the conductor output voltage is near the target voltage, the provision of bias signal masks noises sampled during a last sampling operation that preceded the charge operation.

9. The device according to claim 1 wherein the charge accelerator is coupled to a center of the output conductor.

10. The device according to claim 1 wherein during a second readout phase of the pixel, the pixel is configured to attempt to charge the output conductor to a pixel data voltage and the charge accelerator is configured to perform an additional sampling operation and an additional charge operation; wherein during the additional sampling operation the charge accelerator is configured to sample an additional change in the output conductor voltage; wherein during the additional charge operation the charge accelerator is configured to output an additional charge accelerator output signal that is responsive to the additional change of the output conductor voltage, wherein once provided, the additional charge accelerator output signal accelerates a charging of the output conductor to an additional target voltage that is proximate to the pixel data voltage; wherein the additional sampling operation and the additional charge operation do not overlap.

11. A device, comprising multiple pixels that are arranged in multiple groups of pixels; wherein the multiple groups of pixels are coupled to multiple readout circuits via multiple output conductor; wherein a given charge accelerator of a given group of pixels is adapted to output a given charge accelerator output signal for accelerating a charging of given output conductor that is coupled to the given group of pixels; wherein the given charge accelerator is further adapted to output to a neighboring output conductor of a neighboring group of pixels an additional charge accelerator output signal;
wherein during a readout phase of a pixel of the given group of pixels, the pixel is configured to attempt to charge the given output conductor to a pixel reset voltage and the given charge accelerator is configured to perform a sampling operation and a charge operation;
wherein during the sampling operation the given charge accelerator is configured to sample a change in an output conductor voltage of the given output conductor;
wherein during the charge operation the given charge accelerator is configured to output a charge accelerator output signal that is responsive to the change of the output conductor voltage; and
wherein once provided, the given charge accelerator output signal accelerates a charging of the given output conductor to a target voltage that is proximate to the pixel reset voltage; wherein the sampling operation and the charge operation do not overlap.

12. The device according to claim 11 wherein the additional charge accelerator output signal and the given charge accelerator output signal have reverse polarities.

13. The device according to claim 11 wherein the additional charge accelerator output signal has a lower magnitude than the given charge accelerator output signal.

14. The device according to claim 11 wherein a ratio between magnitudes of the additional charge accelerator output signal and the given charge accelerator output signal is responsive to a ratio between a capacitance of the given conductor and a capacitance between the given output conductor and the neighboring output conductor.

15. The device according to claim 11 wherein the given charge accelerator is adapted to output to a plurality of neighboring output conductors of a plurality of neighboring groups of pixels additional charge accelerator output signals.

16. A method comprising:
attempting, by a pixel, during a readout phase of the pixel, to charge an output conductor that is coupled to the pixel to a pixel reset voltage;
performing, during the readout phase of the pixel and by a charge accelerator coupled to the pixel, a sampling operation and a charge operation; and
selecting, by a selection circuit, a pixel to be read by a readout circuit, out of a group of pixels that comprises the pixel and additional pixels; wherein the additional pixels share the output conductor; wherein the charge accelerator and an additional charge accelerator are coupled to different ends of the output conductor;
wherein the performing of the sampling operation comprises sampling by the charge accelerator a change in an output conductor voltage;
wherein the performing of the charge operation comprises outputting by the charge accelerator a charge accelerator output signal that is responsive to the change of the output conductor voltage, wherein once provided, the charge accelerator output signal accelerates a charging of the output conductor to a target voltage that is proximate to the pixel reset voltage;
wherein the sampling operation and the charge operation do not overlap.

17. A method comprising:
attempting, by a pixel that belongs to a given group of pixels out of multiple groups of pixels, during a readout phase of the pixel, to charge a given output conductor that is coupled to the pixel to a pixel reset voltage;
performing, during the readout phase of the pixel and by a given charge accelerator coupled to the given group of pixels, a sampling operation and a charge operation;
wherein the performing of the sampling operation comprises sampling by the given charge accelerator a change in a given output conductor voltage;
wherein the performing of the charge operation comprises outputting by the given charge accelerator a given charge accelerator output signal that is responsive to the change of the given output conductor voltage, wherein once provided, the charge given accelerator output signal accelerates a charging of the given output conductor to a target voltage that is proximate to the pixel reset voltage;
wherein the sampling operation and the charge operation do not overlap; and wherein the multiple groups of pixels are coupled to multiple readout circuits via multiple output conductor; and
wherein the method further comprises outputting, by the given charge accelerator to a neighboring output conductor of a neighboring group of pixels, an additional charge accelerator output signal.

* * * * *